United States Patent
Kim et al.

(10) Patent No.: US 8,779,428 B2
(45) Date of Patent: Jul. 15, 2014

(54) TRANSISTORS AND ELECTRONIC DEVICES INCLUDING THE SAME

(75) Inventors: Eok-su Kim, Seongnam-si (KR);
Sang-yoon Lee, Seoul (KR);
Myung-kwan Ryu, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 586 days.

(21) Appl. No.: 13/167,299

(22) Filed: Jun. 23, 2011

(65) Prior Publication Data
US 2012/0146713 A1 Jun. 14, 2012

(30) Foreign Application Priority Data
Dec. 10, 2010 (KR) ........................ 10-2010-0126357

(51) Int. Cl.
*H01L 29/04* (2006.01)

(52) U.S. Cl.
USPC 257/59; 257/60; 257/E29.003; 257/E29.275; 257/E21.412; 438/157

(58) Field of Classification Search
USPC ............ 257/60, 59, E29.003, E29.275, 257/E21.412; 438/157
See application file for complete search history.

(56) References Cited

U.S. PATENT DOCUMENTS

| 5,793,072 A * | 8/1998 | Kuo ............................ 257/241 |
| 2006/0068532 A1 | 3/2006 | Schuele et al. |
| 2006/0081936 A1 | 4/2006 | Kim et al. |

FOREIGN PATENT DOCUMENTS

| JP | 4069648 A | 9/2003 |
| KR | 1995-0003898 | 12/1998 |
| KR | 100684514 | 5/2006 |

OTHER PUBLICATIONS

English Abstract of Korean Publication No. 1995-003898, published Feb. 17, 1995.

* cited by examiner

*Primary Examiner* — Marc Armand
(74) *Attorney, Agent, or Firm* — Harness, Dickey & Pierce, P.L.C.

(57) ABSTRACT

A transistor includes a first active layer having a first channel region and a second active layer having a second channel region. A first gate of the transistor is configured to control electrical characteristics of at least the first active layer and a second gate is configured to control electrical characteristics of at least the second active layer. A source electrode contacts the first and second active layers. A drain electrode also contacts the first and second active layers.

33 Claims, 9 Drawing Sheets

< COMPARATIVE EXAMPLE >

TRANSISTORS AND ELECTRONIC DEVICES INCLUDING THE SAME

CROSS-REFERENCE TO RELATED APPLICATION(S)

This application claims priority under 35 U.S.C. §119 to Korean Patent Application No. 10-2010-0126357, filed on Dec. 10, 2010, in the Korean Intellectual Property Office, the entire contents of which is incorporated herein by reference.

BACKGROUND

1. Field

Example embodiments relate to transistors and electronic devices including the same.

2. Description of the Related Art

Transistors are used for various purposes in electronic devices. For example, transistors may be used as switching devices, driving devices, and as a basic element of various circuits in electronic devices. Because thin film transistors (TFTs) may be formed on glass substrates or plastic substrates, TFTs may be used in the field of flat panel display devices such as liquid crystal display (LCD) devices and organic light-emitting display (OLED) devices.

Transistor characteristics may vary based on the material of the channel layer. Accordingly, the material of the channel layer may be a relatively important factor in determining transistor characteristics.

SUMMARY

Example embodiments provide transistors with improved operational characteristics. Example embodiments also provide methods of operating transistors, methods of manufacturing transistors, and electronic devices including transistors having improved operational characteristics.

Additional aspects will be set forth in part in the description which follows and, in part, will be apparent from the description, or may be learned by practice of example embodiments.

At least one example embodiment provides a transistor including: a first active layer having a first channel region; a second active layer having a second channel region; a first gate to control electrical characteristics of at least the first active layer; a second gate to control electrical characteristics of at least the second active layer; a source electrode contacting the first and second active layers; and a drain electrode contacting the first and second active layers.

According to at least some example embodiments, at least a portion of each of the source electrode and the drain electrode may be disposed between the first and second active layers. For example, an end portion of the source electrode may be disposed between the first and second active layers, and an end portion of the drain electrode may also be disposed between the first and second active layers. The first and second active layers between the source electrode and the drain electrode may contact each other.

At least one of the first and second active layers may include an oxide semiconductor. Alternatively, at least one of the first and second active layers may include a non-oxide semiconductor.

According to at least one example embodiment, one of the first and second active layers may include an oxide semiconductor, whereas the other may include a non-oxide semiconductor.

The first and second active layers may be disposed between the first and second gates. In this example, the first active layer may be disposed closer to the first gate than the second active layer, and the second active layer may be disposed closer to the second gate than the first active layer.

At least one of the first and second active layers may cover an entire surface of at least one of the source electrode and the drain electrode.

The first and second gates may be electrically connected to or insulated from each other.

According to at least some example embodiments, a middle portion of the first and second active layers may contact one another. A first end portion of the second active layer may be formed on an upper surface of the source electrode, and a second end portion of the second active layer may be formed on an upper surface of the drain electrode. An end portion of the source electrode may be formed between the first and second active layers, and an end portion of the drain electrode may be formed between the first and second active layers.

According to at least some example embodiments, a first gate insulating layer may be formed on an upper surface of the first gate. In this example, the first active layer may be formed on an upper surface of the first gate insulating layer, the source electrode may be formed on the first gate insulating layer and an upper surface of a first end portion of the first active layer, and the drain electrode may be formed on the first gate insulating layer and an upper surface of a second end portion of the first active layer. The second active layer may be formed on an upper surface of a middle portion of the first active layer, an upper surface of a portion of the source electrode corresponding to the first end portion of the first active layer, and an upper surface of a portion of the drain electrode corresponding to the second end portion of the first active layer.

According to at least some example embodiments, a second gate insulating layer may be formed on an upper surface of the source electrode, the drain electrode and the second active layer. In this example, the second gate may be formed on an upper surface of the second gate insulating layer.

According to at least some example embodiments, a first gate insulating layer may be formed on an upper surface of the first gate. In this example, the first active layer may be formed on an upper surface of the first gate insulating layer, and the source electrode, the drain electrode and a portion of the second active layer may be formed on an upper surface of the first active layer.

At least one other example embodiment provides a method of operating a transistor. According to at least this example embodiment, the transistor includes: a first active layer having a first channel region; a second active layer having a second channel region; a first gate to control electrical characteristics of at least the first active layer; a second gate to control electrical characteristics of at least the second active layer; a source electrode contacting the first and second active layers; and a drain electrode contacting the first and second active layers. The method of operating the transistor includes: applying a voltage to at least one of the first and second gates.

At least one other example embodiment provides a method of operating a transistor. According to at least this example embodiment, the transistor includes: a first active layer having a first channel region; a second active layer having a second channel region; a first gate to control electrical characteristics of at least the first active layer; a second gate to control electrical characteristics of at least the second active layer; a source electrode contacting the first and second active layers; and a drain electrode contacting the first and second active layers. The method of operating the transistor includes: selectively activating and deactivating the transistor by independently controlling electrical characteristics of the first and second active layers. The electrical characteristics are independently controlled by selectively applying voltages to the first and second gates.

According to at least some example embodiments, a same voltage may be applied to the first and second gates. Alternatively, different voltages may be applied to the first and second gates. In one example, a turn-on voltage or a turn-off voltage may be applied to only one of the first and second gates. Alternatively, a turn-on voltage may be applied to one of the first and second gates, whereas a turn-off voltage may be applied to the other one of the first and second gates.

At least one other example embodiment provides an electronic device including a transistor. According to at least this example embodiment, the transistor includes: a first active layer having a first channel region; a second active layer having a second channel region; a first gate to control electrical characteristics of at least the first active layer; a second gate to control electrical characteristics of at least the second active layer; a source electrode contacting the first and second active layers; and a drain electrode contacting the first and second active layers. The electronic device may be a flat panel display device such as a liquid crystal display device, an organic light-emitting display device or the like. The transistor may be used as a switching device and/or a driving device.

At least one other example embodiment provides a method of manufacturing a transistor. According to at least this example embodiment, the method includes: forming a first gate; forming a first gate insulating layer to cover the first gate; forming a first active layer on the first gate insulating layer; forming a source electrode and a drain electrode to contact a first region and a second region of the first active layer, respectively; forming a second active layer on the first active layer to cover at least portions of the source electrode and the drain electrode; forming a second gate insulating layer to cover the second active layer; and forming a second gate on the second gate insulating layer.

According to at least some example embodiments, the method may further include: forming a first semiconductor layer on the first gate insulating layer; patterning the first semiconductor layer to form the first active layer; forming the source electrode and the drain electrode contacting the first active layer; forming a second semiconductor layer to cover the first active layer, the source electrode, and the drain electrode; and patterning the second semiconductor layer to form the second active layer.

According to at least some example embodiments, the method may include: forming a first semiconductor layer on the first gate insulating layer; forming the source electrode and the drain electrode on the first semiconductor layer; forming a second semiconductor layer to cover the first semiconductor layer, the source electrode, and the drain electrode; and pattering the second semiconductor layer and the first semiconductor layer to form the first and second active layers.

At least one of the first and second active layers may include an oxide semiconductor.

At least one of the first and second active layers may include a non-oxide semiconductor.

One of the first and second active layers may include an oxide semiconductor, and the other one of the first and second active layers may include a non-oxide semiconductor.

BRIEF DESCRIPTION OF THE DRAWINGS

These and/or other aspects will become apparent and more readily appreciated from the following description of example embodiments, taken in conjunction with the accompanying drawings in which.

DETAILED DESCRIPTION

Figure 1:
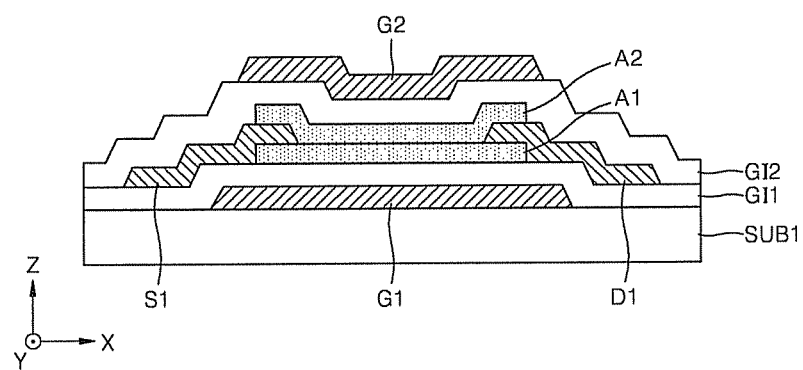
FIG. 1 is a cross-sectional view of a transistor according to an example embodiment.

Various example embodiments will now be described more fully with reference to the accompanying drawings in which example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

Although the terms "first," "second," etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments and intermediate structures. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, example embodiments of transistors, methods of operating transistors, methods of manufacturing transistors, and electronic devices including transistors will be described with reference to the attached drawings. In the drawings, the thicknesses of layers and regions are exaggerated for clarity. Like reference numerals in the drawings denote like elements.

FIG. 1 is a cross-sectional view of a transistor according to an example embodiment.

Referring to FIG. 1, a first gate G1 is disposed on a substrate SUB1. The substrate SUB1 may be a glass substrate, a plastic substrate, a silicon substrate, or any other substrate suitable for manufacturing a semiconductor device. The first gate G1 may be formed of an electrode material (e.g., a metal, a conductive oxide, or the like).

A first gate insulating layer GI1 is formed on the substrate SUB1 to cover the first gate G1. The first gate insulating layer GI1 may be a silicon oxide layer, a silicon oxynitride layer, a silicon nitride layer, or another material layer such as a high-k dielectric material layer with a dielectric constant higher than a silicon nitride layer. The first gate insulating layer GI1 may have a single layer or a multi-layer structure.

Still referring to FIG. 1, a first active layer A1 is disposed on the first gate insulating layer GI1 above the first gate G1. A width of the first active layer A1, which is measured in the X-axis direction in FIG. 1, is smaller than a width of the first gate G1, which is also measured in the X-axis direction. However, in alternative example embodiments, the width of the first active layer A1 may be greater than or equal to the width of the first gate G1. The first active layer A1 may be formed of an oxide semiconductor such as a ZnO-based oxide semiconductor. In this example, the ZnO-based oxide semiconductor may include at least one selected from a group including a group 13 element such as indium (In), gallium (Ga) and aluminum (Al), a group 14 element such as tin (Sn) and silicon (Si), a group 4 element (transition metal) such as zirconium (Zr), hafnium (Hf) and titanium (Ti), a group 2 element such as magnesium (Mg), a group 3 element (transition metal) such as yttrium (Y) and lanthanum (La), a group 11 element (transition metal) such as copper (Cu), and other transition metals such as tantalum (Ta) and chromium (Cr).

Alternatively, the first active layer A1 may be formed of a non-oxide semiconductor. The non-oxide semiconductor may be, for example, a semiconductor including at least one of a group 13 element, a group 14 element, a group 15 element, and a group 16 element, or a compound thereof. In more detail, for example, the non-oxide semiconductor may be Si, Ge, C, SiGe, GaN, GaAs, InSb, InP, CdS, or the like. Alternatively, the non-oxide semiconductor may be an organic semiconductor, graphene, carbon nanotube (CNT), or the like. It is noted that the above materials of the semiconductor are just examples, and thus, various other semiconductor materials may be used to form the first active layer A1.

The first active layer A1 may have a single layer or a multi-layer structure.

Still referring to FIG. 1, a source electrode S1 is disposed on the first gate insulating layer GI1 to contact a first end or outer portion of the first active layer A1. A drain electrode D1 is disposed on the first gate insulating layer GI1 to contact a second end or outer portion of the first active layer A1. The first and second end portions are at opposite sides of the first active layer A1 shown in FIG. 1.

In the example embodiment shown in FIG. 1, the source electrode S1 is formed on an upper surface of the first gate insulating layer GI1, a sidewall of the first active layer A1 and an upper surface of the first end portion of the first active layer A1. Similarly, the drain electrode D1 is formed on an upper surface of the first gate insulating layer GI1, a sidewall of the first active layer A1 and an upper surface of the second end portion of the first active layer A1. Each of the source electrode S1 and the drain electrode D1 may be formed of the same or substantially the same material as the first gate G1. Alternatively, the source electrode S1 and the drain electrode D1 may be formed of a different material than the first gate G1. Each of the source electrode S1 and the drain electrode D1 may have a single layer or multilayer structure.

Referring still to FIG. 1, a second active layer A2 is disposed on an upper surface of the first active layer A1 and portions of the source electrode S1 and the drain electrode D1. As shown in FIG. 1, for example, the second active layer A2 extends onto portions of the source electrode S1 and the drain electrode D1, which are formed on the first active layer A1. In this example, the second active layer A2 contacts the first active layer A1 at a middle portion of the second active layer A2, but is formed on a portion of the source electrode S1 and the drain electrode D1 at the end or outer portions of the second active layer A2. Thus, in the example embodiment shown in FIG. 1, an end portion of each of the source electrode S1 and the drain electrode D1 is disposed between the first and second active layers A1 and A2.

Like the first active layer A1, the second active layer A2 may be formed of an oxide semiconductor or a non-oxide semiconductor. Examples of the oxide semiconductor and the non-oxide semiconductor may be similar to the above-described materials of the first active layer A1.

According to at least some example embodiments, the first and second active layers A1 and A2 may be formed of the same or different materials. That is, if both the first and second active layers A1 and A2 are formed of an oxide semiconductor (or a non-oxide semiconductor), then the first and second active layers A1 and A2 may be formed of the same material-based oxide semiconductors (or the same material-based non-oxide semiconductor) or different material-based oxide semiconductors (or different material-based non-oxide semiconductors). If the first and second active layers A1 and A2 are formed of the same material-based oxide semiconductors (or the same material-based non-oxide semiconductor), then the first and second active layers A1 and A2 may have the same or substantially the same composition ratio. Alternatively, the first and second active layers A1 and A2 may have different composition ratios.

According to at least some alternative example embodiments, one of the first and second active layers A1 and A2 may be formed of an oxide semiconductor, and the other may be formed of a non-oxide semiconductor. If the first and second active layers A1 and A2 are formed of different materials (or materials with different composition ratios), then electrical characteristics of the first and second active layers A1 and A2 may differ. Thicknesses of the first and second active layers A1 and A2 may be the same or may differ. In addition, each of the first and second active layers A1 and A2 may have a single layer or multi-layer structure.

Referring back to FIG. 1, a second gate insulating layer GI2 is disposed on the first gate insulating layer GI1 to cover the second active layer A2, the source electrode S1, and the drain electrode D1. In at least this example embodiment, the second gate insulating layer GI2 may function as a passivation layer, which protects the first active layer A1, the second active layer A2, the source electrode S1, and the drain electrode D1. Similar to the first gate insulating layer GI1, the second gate insulating layer GI2 may include a silicon oxide layer, a silicon oxynitride layer, a silicon nitride layer, or another material layer such as a high-k dielectric material layer with a dielectric constant higher than a silicon nitride layer. The second gate insulating layer GI2 may have a single layer or a multi-layer structure.

A second gate G2 is disposed on the second gate insulating layer GI2 above the first gate G1 the first active layer A1 and the second active layer A2. The second gate G2 may be formed of an electrode material (e.g., a metal, a conductive oxide, or the like). As shown in FIG. 1, a width of the second gate G2, which is measured along the X-axis direction, may be greater than a width of the second active layer A2, which is also measured along the X-axis direction. Alternatively, the width of the second gate G2 may be less than or equal to the width of the second active layer A2.

Figure 2:
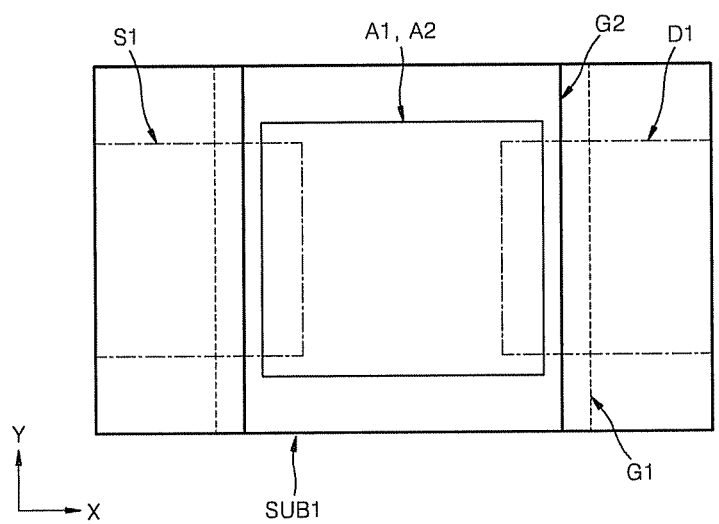
FIG. 2 is a plan view of the transistor shown in FIG. 1.

FIG. 2 is a plan view of the transistor of FIG. 1. The plan structure of FIG. 2 is just an example, and thus, may be variously changed.

Referring to FIG. 2, when the transistor includes first and second active layers A1 and A2 and first and second gates G1 and G2, and at least a portion of each of the source electrode S1 and the drain electrode D1 is disposed between the first and second active layers A1 and A2 as shown in FIG. 1, the transistor may have improved operational characteristics and/or performance. In more detail, because the first and second active layers A1 and A2 contact lower and upper surfaces of the source electrode S1 and the drain electrode D1, respectively, a contact area therebetween may increase, and current flow (or current density) between the source electrode S1 and the drain electrode D1 may be increase.

Additionally with regard to the example embodiment shown in FIG. 1, electrical characteristics of the first active layer A1 may be controlled independently of the electrical characteristics of the second active layer A2. For example, electrical characteristics of the first active layer A1 may be independently controlled by the first gate G1, and electrical characteristics of the second active layer A2 may be independently controlled by the second gate G2. With regard to FIG. 1, for example, independently controlling the electrical characteristics of the first and second active layers A1 and A2 by the corresponding gate of the first and second gates G1 and G2 is easier because the source electrode S1 and the drain electrode D1 are not disposed between the first gate G1 and the first active layer A1, and the source electrode S1 and the drain electrode D1 are not disposed between the second gate G2 and the second active layer A2.

If a portion between the second gate G2 and the second active layer A2 is blocked by portions of the source electrode S1 and the drain electrode D1, then the controlling of the electrical characteristics of the second active layer A2 by the second gate G2 may be hindered and/or obstructed. However, according to at least the example embodiment shown in FIG. 1, the source electrode S1 and the drain electrode D1 do not block portions between the first gate G1 and the first active layer A1, or between the second gate G2 and the second active layer A2. Thus, the electrical characteristics of the first and second active layers A1 and A2 may be more easily and independently controlled, thereby improving operational characteristics of the transistor and/or increasing a degree of freedom of operating methods of transistors.

Figure 3:
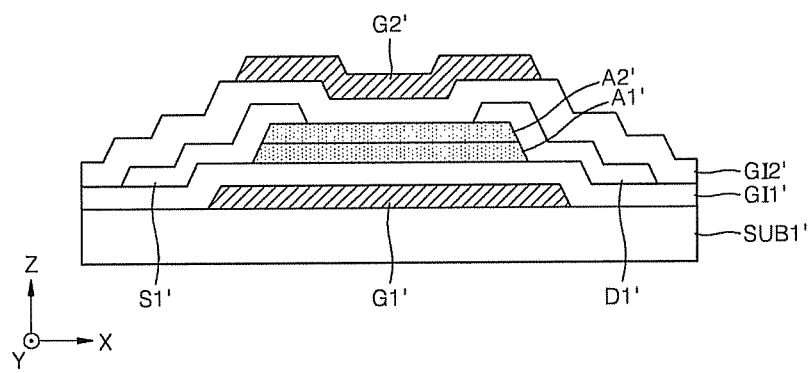
FIG. 3 is a cross-sectional view of a transistor according to a comparative example.

FIG. 3 is a cross-sectional view of a transistor according to a comparative example.

Referring to FIG. 3, in the transistor of the comparative example, the second active layer A2' is adhered to and formed directly on the first active layer A1'. And, a source electrode S1' and a drain electrode D1' extend onto an upper surface of the second active layer A2'. In this structure, controlling characteristics of the second active layer A2' by the second gate G2' may be hindered and/or obstructed because portions of the source electrode S1' and the drain electrode D1 are formed between portions of the second gate G2' and the second active layer A2'. Thus, characteristics of the first and second active layers A1' and A2' are primarily controlled by the first gate G1', whereas the second gate G2' performs only an auxiliary function. In addition, a current flow (or current density) between the source electrode S1' and the drain electrode D1' may be lower than that in the transistor of FIG. 1 because a contact area between the source and drain electrodes S1' and D1' and the active layers A1' and A2' is smaller. In FIG. 3, reference numerals SUB1', GI1' and GI2' denote a substrate, a first gate insulating layer, and a second gate insulating layer, respectively.

Figure 4:
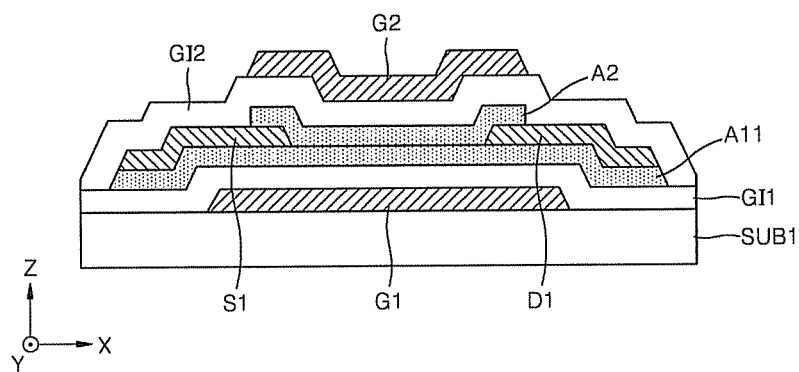
FIG. 4 is a cross-sectional view of a transistor according to another example embodiment.

FIG. 4 is a cross-sectional view of a transistor according to another example embodiment. The example embodiment shown in FIG. 4 is similar to the example embodiment shown in FIG. 1, and thus, descriptions of similar components will be omitted.

Referring to FIG. 4, the example embodiment shown in FIG. 4 differs from the example embodiment shown in FIG. 1 in that a first active layer A11 is disposed to cover a lower surface of the middle portion of the second active layer A2 and the entire lower surface of the source electrode S1 and the drain electrode D1. Accordingly, the first active layer A11 is formed: between the upper surface of the first gate insulating layer GI1 and the lower surface of the source electrode S1; between the upper surface of the first gate insulating layer GI1 and the lower surface of the drain electrode D1; and between the upper surface of the first gate insulating layer GI1 and the lower surface of the middle portion of the second active layer A2. In this example, an effective channel region of the first active layer A11 is similar to an entire region of the first active layer A1 of FIG. 1. That is, for example, in the first active layer A11, a region (a central or middle portion) between the source electrode S1 and the drain electrode D1 may be the effective channel region. In FIG. 4, elements other than the first active layer A11 may be the same as (or similar to) those in FIG. 1. Thus, a detailed description is omitted.

Figure 5:
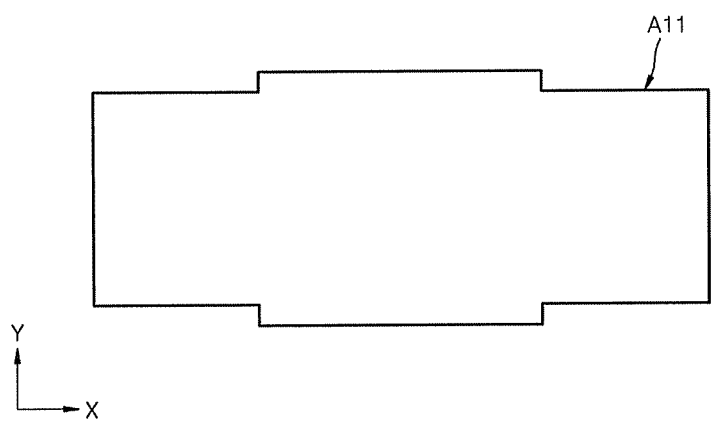
FIG. 5 is a plan view of the first active layer shown in FIG. 4.

FIG. 5 is a plan view of the first active layer A11 shown in FIG. 4. The plan structure of the first active layer A11 shown in FIG. 5 is the same or substantially the same as the plan structure formed by combining the second active layer A2, the source electrode S1, and the drain electrode D1 discussed above with regard to FIGS. 1 and 2.

The example embodiment shown in FIGS. 4 and 5 includes an enlarged structure of the first active layer A11 entirely covering the lower surfaces of the source electrode S1 and the drain electrode D1. Although not shown, according to at least one other example embodiment, the second active layer A2 may also have an enlarged structure similar to or the same as the first active layer A11. For example, the second active layer A2 may have an enlarged structure so as to cover a middle portion of the first active layer A11 (or A1) and entirely cover upper surfaces of the source electrode S1 and the drain electrode D1.

FIGS. 6 through 10 are cross-sectional views illustrating a method of operating a transistor according to an example embodiment. The operating method illustrated in FIGS. 6 through 10 will be described with regard to the transistor shown in FIG. 1. However, example embodiments should not be limited thereto. Rather, similar methods may be applied to the transistor shown in, for example, FIG. 4.

Figure 6:
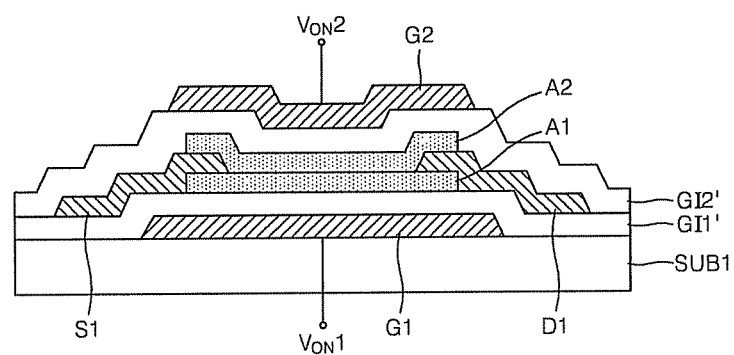
FIGS. 6 through 10 are cross-sectional views illustrating a method of operating a transistor according to an example embodiment.

Referring to FIG. 6, a first turn-on voltage $V_{ON}1$ is applied to the first gate G1, and a second turn-on voltage $V_{ON}2$ is applied to the second gate G2. The first turn-on voltage $V_{ON}1$ forms a channel in the first active layer A1, and the second turn-on voltage $V_{ON}2$ forms a channel in the second active layer A2. By applying a given, desired or predetermined voltage between the source electrode S1 and the drain electrode D1, a given, desired or predetermined current flows from the source electrode S1 to the drain electrode D1 through the first and second active layers A1 and A2.

According to at least this example embodiment, because the first active layer A1 contacts lower surfaces of the source electrode S1 and the drain electrode D1, and the second active layer A2 contacts upper surfaces of the source electrode S1 and the drain electrode D1, a contact area between the channel of the transistor and the source and drain electrodes S1 and D1 is increased. Accordingly, the current (or current density) flowing from the source electrode S1 to the drain electrode D1 may also increase.

According to at least some example embodiments, the first turn-on voltage $V_{ON}1$ and the second turn-on voltage $V_{ON}2$ may be the same or different. In one example, when the materials, characteristics and/or thicknesses of the first and second active layers A1 and A2 are different, an intensity of a voltage (e.g., a gate voltage) required to activate the first and second active layers A1 and A2 to form channels in the first and second active layers A1 and A2 may be different. In addition, if necessary, even if the materials of the first and second active layers A1 and A2 are the same or substantially the same, the first and second turn-on voltages $V_{ON}1$ and $V_{ON}2$ applied to the first and second gates G1 and G2 may be configured differently.

Figure 7:
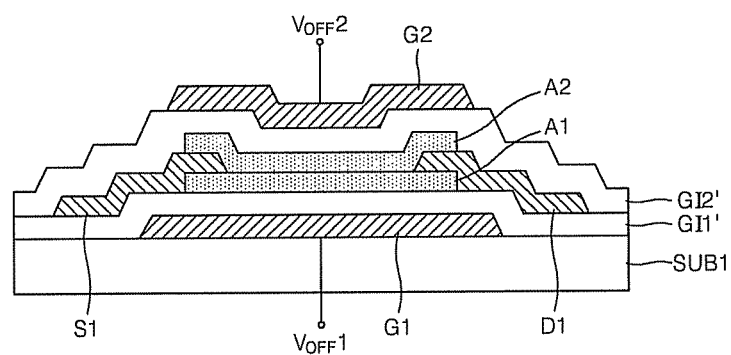

Referring to FIG. 7, the transistor is turned off by applying a first turn-off voltage $V_{OFF}1$ to the first gate G1, and applying a second turn-off voltage $V_{OFF}2$ to the second gate G2. In this example, an effective current does not flow between the source electrode S1 and the drain electrode D1. The first turn-off voltage $V_{OFF}1$ and the second turn-off voltage $V_{OFF}2$ may be the same or different.

FIGS. 6 and 7 show an example in which the first and second turn-on voltages $V_{ON}1$ and $V_{ON}2$, or the first and second turn-off voltages $V_{OFF}1$ and $V_{OFF}2$ are applied simultaneously or concurrently to the first and second gates G1 and G2. Alternatively, a turn-on voltage may be applied to one of the first and second gates G1 and G2 and a turn-off voltage may be applied to the other of the first and second gates G1 and G2. An example of this alternative example embodiment is shown in FIGS. 8 and 9.

Figure 8:
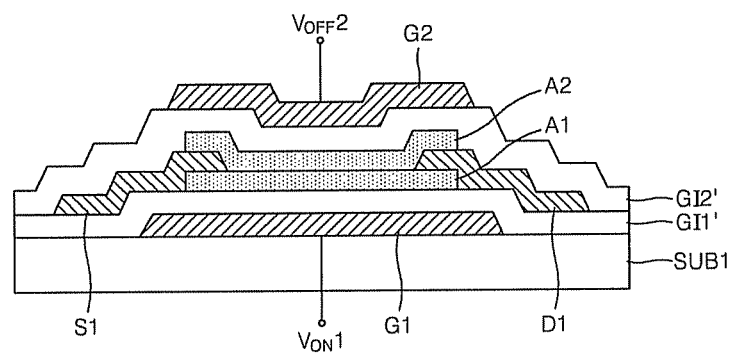

Referring to FIG. 8, the first turn-on voltage $V_{ON}1$ is applied to the first gate G1, whereas the second turn-off voltage $V_{OFF}2$ is applied to the second gate G2. In this example, only the first active layer A1 is activated, and thus, a channel is formed in only the first active layer A1, but not the second active layer A2. Accordingly, a current flows from the source electrode S1 to the drain electrode D1 through the first active layer A1.

Figure 9:
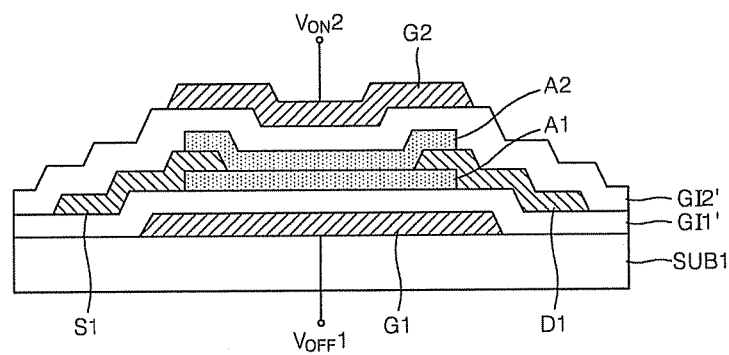

In FIG. 9, the first turn-off voltage $V_{OFF}1$ is applied to the first gate G1, whereas the second turn-on voltage $V_{ON}2$ is applied to the second gate G2. In this example, only the second active layer A2 is activated, and thus, a channel is formed in only the second active layer A2, but not the first active layer A1. Accordingly, a current flows from the source electrode S1 to the drain electrode D1 through the second active layer A2.

FIGS. 6 through 9 show examples in which voltages are applied to both the first and second gates G1 and G2. Alternatively, a turn-on or turn-off voltage may be applied to only one of the first and second gates G1 and G2. In one example, a voltage is not applied to the other one of the first and second gates G1 and G2. Alternatively, the other of the first and second gates G1 and G2 may be grounded.

When a turn-on or turn-off voltage is applied to only one of the first and second gates G1 and G2, electrical characteristics of one or more of the first and second active layers A1 and A2 may be controlled by the one gate to which the voltage is applied. For example, when a voltage is applied to only the first gate G1, the first active layer A1 and the second active layer A2 may be controlled by the first gate G1. Similarly, both the first active layer A1 and the second active layer A2 may be controlled by the second gate G2 when a voltage is applied to only the second gate G2.

In addition, FIGS. 6 through 9 show an example in which the first gate G1 and the second gate G2 are electrically separated (e.g., insulated and/or disconnected) from each other.

Figure 10:
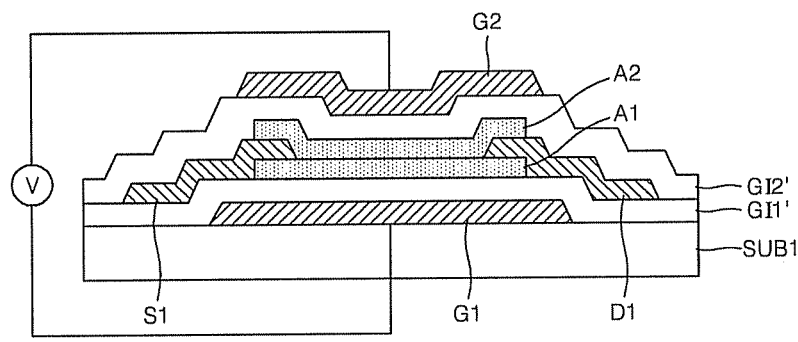

FIG. 10 shows an example embodiment in which the first gate G1 and the second gate G2 are electrically connected to each other. In this example, the same or substantially the same or substantially the same voltage V is simultaneously or concurrently applied to the first gate C1 and the second gate G2.

FIGS. 6 through 10 show example methods of operating the transistor of FIG. 1. However, the operating methods shown and described with regard to FIGS. 6 through 10 may be used in connection with the transistor shown in FIG. 4.

FIGS. 11A through 11E are cross-sectional views showing an example embodiment of a method of manufacturing the transistor shown in FIG. 1. In FIGS. 1 and 11A through 11E like reference numerals in the drawings denote like elements.

Figure 11A:
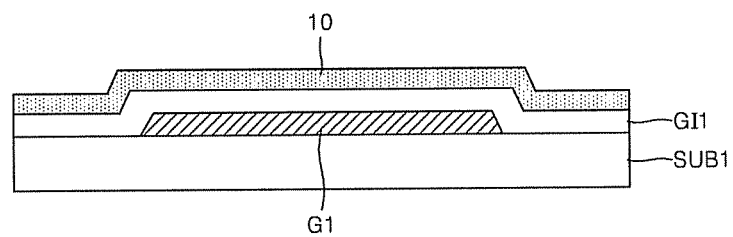
FIGS. 11A through 11E are cross-sectional views showing a method of manufacturing a transistor according to an example embodiment.

Referring to FIG. 11A, a first gate C1 is formed on a substrate SUB1. As mentioned above, the substrate SUB1 may be a glass substrate, a plastic substrate, a silicon substrate, or any substrate used to manufacture a semiconductor device. The first gate G1 may be formed of an electrode material (e.g., a metal, a conductive oxide, or the like).

A first gate insulating layer GI1 is then formed to cover the first gate G1. The first gate insulating layer GI1 may be a silicon oxide layer, a silicon oxynitride layer, a silicon nitride layer, or another material layer such as a high-k dielectric material layer with a dielectric constant higher than a silicon nitride layer. The first gate insulating layer GI1 may have a single layer or multi-layer structure.

Still referring to FIG. 11A, a first semiconductor layer 10 is formed on the first gate insulating layer GI1. The first semiconductor layer 10 may be formed of an oxide semiconductor or a non-oxide semiconductor.

Figure 11B:
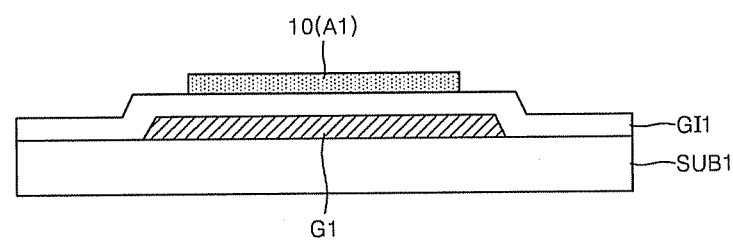

Referring to FIG. 11B, the first semiconductor layer 10 is patterned to form a first active layer A1 above the first gate G1. Hereinafter, the patterned first semiconductor layer 10 is referred to as the first active layer A1.

Figure 11C:
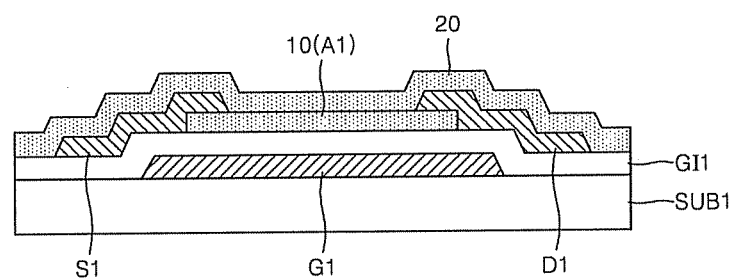

Referring to FIG. 11C, a source electrode S1 is formed on the first gate insulating layer GI1 to contact a first end or outer portion of the first active layer A1 as discussed above with regard to FIG. 1. And, a drain electrode D1 is formed on the first gate insulating layer GI1 to contact a second end or outer portion of the first active layer A1 as discussed above with regard to FIG. 1.

Each of the source electrode S1 and the drain electrode D1 may be formed of the same or substantially the same material as the first gate G1. Alternatively, each of the source electrode S1 and the drain electrode D1 may be formed of a different material layer from the first gate G1. Each of the source electrode S1 and the drain electrode D1 may have a single layer or a multi-layer structure.

Still referring to FIG. 11C, a second semiconductor layer 20 is formed on the first gate insulating layer GI1 to cover the first active layer A1, the source electrode S1, and the drain electrode D1. The second semiconductor layer 20 may be formed of an oxide semiconductor or a non-oxide semiconductor.

Figure 11D:
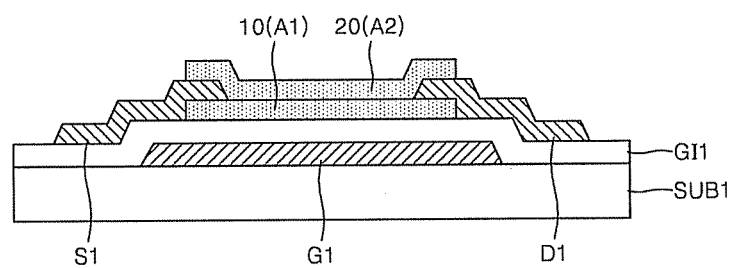

Referring to FIG. 11D, the second semiconductor layer 20 is patterned to form a second active layer A2 above the first active layer A1. Hereinafter, the patterned second semiconductor layer 20 is referred to as the second active layer A2.

Figure 11E:
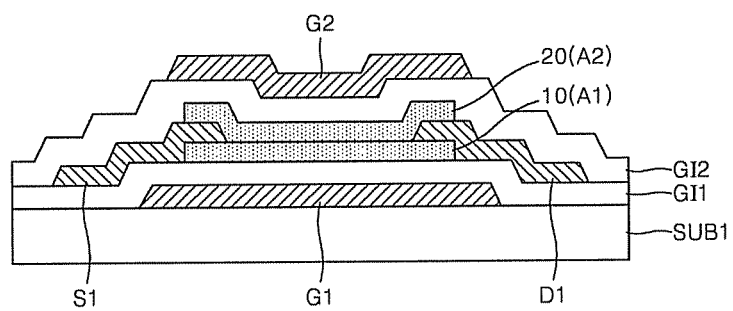

Referring to FIG. 11E, a second gate insulating layer GI2 is formed on the first gate insulating layer GI1 to cover the second active layer A2, the source electrode S1, and the drain electrode D1. Similar to the first gate insulating layer GI1, the second gate insulating layer GI2 may include a silicon oxide layer, a silicon oxynitride layer, a silicon nitride layer, or another material layer such as a high-k dielectric material layer with a dielectric constant higher than a silicon nitride layer. The second gate insulating layer GI2 may have a single layer or a multi-layer structure.

Still referring to FIG. 11E, a second gate G2 is formed on the second gate insulating layer GI2 above the second active layer A2. The second gate G2 may be formed of an electrode material (e.g., a metal, a conductive oxide, or the like), and may have a single layer or a multi-layer structure. The transistor manufactured according to the above-described example embodiment may be annealed at a given, desired or predetermined temperature.

FIGS. 12A through 12D are cross-sectional views showing an example embodiment of a method of manufacturing the transistor shown in FIG. 4.

Figure 12A:
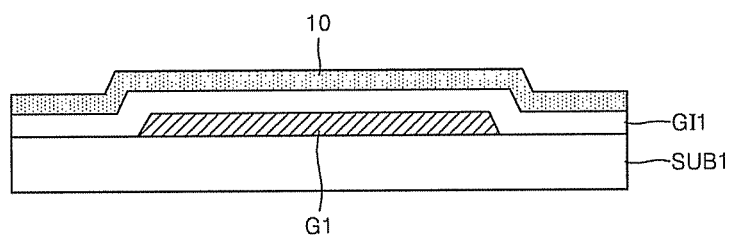
FIGS. 12A through 12D are cross-sectional views showing a method of manufacturing a transistor according to another example embodiment.

Referring to FIG. 12A, a first gate G1, a first gate insulating layer GI1, and a first semiconductor layer 10 are sequentially formed on a substrate SUB1 in the same manner discussed above with regard to FIG. 11A.

Figure 12B:
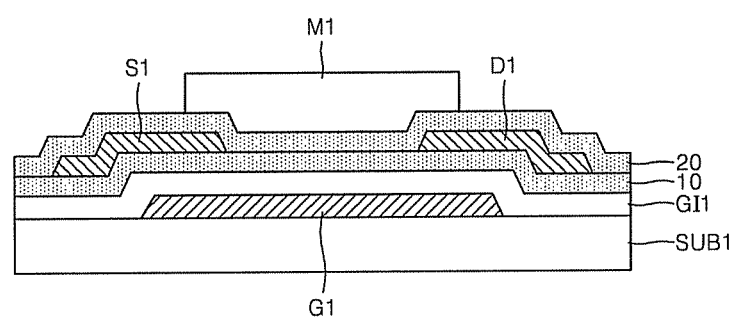

Referring to FIG. 12B, a source electrode S1 and a drain electrode D1 are formed on the first semiconductor layer 10. A middle portion of the first semiconductor layer 10 is left exposed. A second semiconductor layer 20 is formed on the first semiconductor layer 10 to cover the source electrode S1, the drain electrode D1 and the exposed middle portion of the first semiconductor layer 10. A mask layer M1 for patterning the second semiconductor layer 20 is formed on the second semiconductor layer 20. As shown in FIG. 12B, the mask layer M1 covers a middle portion of the second semiconductor layer M1 as well as end portions of the source electrode S1 and the drain electrode D1.

Figure 12C:
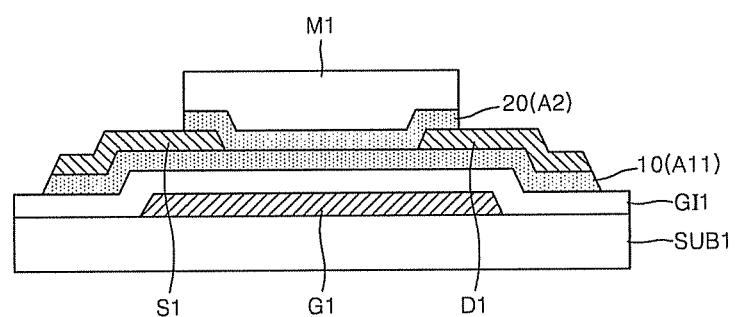

Referring to FIG. 12C, the second semiconductor layer 20 is etched (patterned) using the mask layer M1 as an etch barrier. The first semiconductor layer 10 is also etched (patterned) using the mask layer M1, the source electrode S1, and the drain electrode D1 as an etch barrier. Thus, according to at least this example embodiment, the second semiconductor layer 20 and the first semiconductor layer 10 may be patterned by using a single operation. The patterned first semiconductor layer 10 corresponds to the first active layer A11 and the patterned second semiconductor layer 20 corresponds to the second active layer A2 shown in FIG. 4. In this example, the first active layer A11 has the plan structure shown in FIG. 5.

Figure 12D:
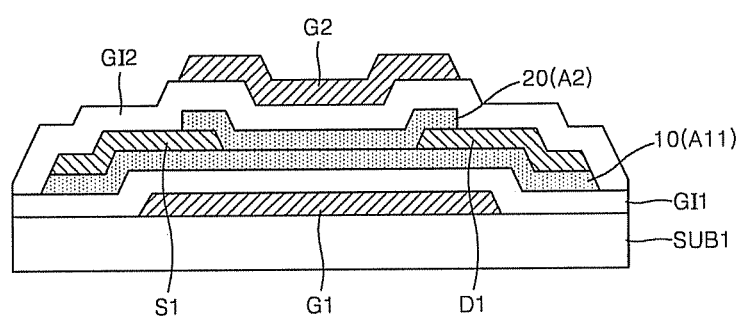

Referring to FIG. 12D, after removing the mask layer M1, a second gate insulating layer GI2 is formed on the first gate insulating layer GI1 to cover the second active layer A2, the source electrode S1, and the drain electrode D1. A second gate G2 is then formed on the second gate insulating layer GI2 above the second active layer A2. The transistor manufactured according to the above-described example embodiment may be annealed at a given, desired or predetermined temperature.

As shown in FIGS. 12A through 12D, the second semiconductor layer 20 and the first semiconductor layer 10 are patterned using a single operation, thereby simplifying manufacturing processes and/or reducing manufacturing costs. Thus, when transistors according to at least this example embodiment are manufactured, the number of manufacturing processes and/or manufacturing costs may be similar or substantially similar to those used to manufacture a conventional transistor having a single active layer (a single channel layer).

Transistors according to at least some example embodiments may be used as switching devices and/or driving devices in flat panel display devices such as liquid crystal display (LCD) devices, organic light-emitting display (OLED) devices, etc. As described above, because transistors according to at least some example embodiments have improved operational characteristics and/or a higher degree of freedom of operating methods, when the transistors are applied to flat panel display devices, operational characteristics and performance of the flat panel display devices may be improved. Structures of LCD devices and OLED devices are well known, and thus, detailed descriptions thereof will be omitted. Transistors according to at least some example embodiments may be used for various purposes in other electronic devices such as memory devices and logic devices, as well as flat panel display devices.

It should be understood that the example embodiments described herein should be considered in a descriptive sense only and not for purposes of limitation. For example, it will be understood by one of ordinary skill in the art that the transistors illustrated in FIGS. 1 and 4 may be modified and/or changed. In more detail, for example, one of the source electrode S1 and the drain electrode D1 may not be inserted between the first and second active layers A1 and A2 or A11 and A2, central portions of the first and second active layers A1 and A2 or A11 and A2 may not contact each other, and/or the active layers A1, A2 and A11 may each have a multi-layer structure. Also, it will be understood by one of ordinary skill in the art that the method of FIGS. 11A through 11E and the method of FIGS. 12A through 12D may also be variously changed. Furthermore, example embodiments may be applied to various transistors as well as thin film transistors.

Descriptions of features or aspects within each example embodiment should be considered as available for other similar features or aspects in other example embodiments.

What is claimed is:

1. A transistor comprising:
    a first active layer including a first channel region;
    a second active layer including a second channel region;
    a first gate to control electrical characteristics of at least the first active layer;
    a second gate to control electrical characteristics of at least the second active layer;
    a source electrode contacting the first and second active layers; and
    a drain electrode contacting the first and second active layers; wherein at least a portion of the source electrode and at least a portion of the drain electrode is disposed between the first active layer and the second active layer.

2. The transistor of claim 1, wherein an end portion of the source electrode is disposed between the first and second active layers, and an end portion of the drain electrode is disposed between the first and second active layers.

3. The transistor of claim 1, wherein portions of the first and second active layers between the source electrode and the drain electrode contact each other.

4. The transistor of claim 1, wherein at least one of the first and second active layers includes an oxide semiconductor.

5. The transistor of claim 1, wherein at least one of the first and second active layers includes a non-oxide semiconductor.

6. The transistor of claim 1, wherein one of the first and second active layers includes an oxide semiconductor, whereas an other of the first and second active layers includes a non-oxide semiconductor.

7. The transistor of claim 1, wherein the first and second active layers are disposed between the first and second gates.

8. The transistor of claim 1, wherein at least one of the first and second active layers covers an entire surface of at least one of the source electrode and the drain electrode.

9. The transistor of claim 1, wherein the first and second gates are electrically connected to each other.

10. The transistor of claim 1, wherein the first and second gates are electrically insulated from each other.

11. The transistor of claim 1, wherein a middle portion of the first and second active layers contact one another.

12. The transistor of claim 1, further comprising:
    a first gate insulating layer formed on an upper surface of the first gate; wherein
        the first active layer is formed on an upper surface of the first gate insulating layer,
        the source electrode is formed on the first gate insulating layer and an upper surface of a first end portion of the first active layer,
        the drain electrode is formed on the first gate insulating layer and an upper surface of a second end portion of the first active layer, and
        the second active layer is formed on an upper surface of a middle portion of the first active layer, an upper surface of a portion of the source electrode corresponding to the first end portion of the first active layer, and an upper surface of a portion of the drain electrode corresponding to the second end portion of the first active layer.

13. The transistor of claim 1, further comprising:
    a first gate insulating layer formed on an upper surface of the first gate; wherein
        the first active layer is formed on an upper surface of the first gate insulating layer, and
        the source electrode, the drain electrode and a portion of the second active layer are formed on an upper surface of the first active layer.

14. A method of operating the transistor of claim 1, the method comprising:
    applying a voltage to at least one of the first and second gates.

15. A method of operating the transistor of claim 1, the method comprising:
    selectively activating and deactivating the transistor by independently controlling electrical characteristics of the first and second active layers.

16. An electronic device comprising the transistor of claim 1.

17. The transistor of claim 7, wherein the first active layer is disposed closer to the first gate than the second active layer.

18. The transistor of claim 11, wherein a first end portion of the second active layer is formed on an upper surface of the source electrode, and a second end portion of the second active layer is formed on an upper surface of the drain electrode.

19. The transistor of claim 11, wherein an end portion of the source electrode is formed between the first and second active layers, and an end portion of the drain electrode is formed between the first and second active layers.

20. The transistor of claim 12, further comprising:
    a second gate insulating layer formed on an upper surface of the source electrode, the drain electrode and the second active layer; wherein
        the second gate is formed on an upper surface of the second gate insulating layer.

21. The method of claim 14, wherein a same voltage is applied to each of the first and second gates.

22. The method of claim 14, wherein a different voltage is applied to each of the first and second gates.

23. The method of claim 14, wherein one of a turn-on voltage and a turn-off voltage is applied to each of the first and second gates.

24. The method of claim 14, wherein a turn-on voltage is applied to one of the first and second gates, and a turn-off voltage is applied to an other one of the first and second gates.

25. The method of claim 15, wherein the electrical characteristics are independently controlled by selectively applying voltages to the first and second gates.

26. The electronic device of claim 16, wherein the electronic device is a flat panel display device.

27. The transistor of claim 17, wherein the second active layer is disposed closer to the second gate than the first active layer.

28. A method of manufacturing a transistor, the method comprising:
    forming a first gate;
    forming a first gate insulating layer covering the first gate;
    forming a first active layer on the first gate insulating layer;
    forming a source electrode to contact a first region of the first active layer, and a drain electrode to contact a second region of the first active layer;
    forming a second active layer on the first active layer to cover at least a portion of the source electrode and the drain electrode;
    forming a second gate insulating layer to cover the second active layer; and
    forming a second gate on the second gate insulating layer.

29. The method of claim 28, further comprising:
    forming a first semiconductor layer on the first gate insulating layer;

patterning the first semiconductor layer to form the first active layer;

forming the source electrode and the drain electrode that contact the first active layer;

forming a second semiconductor layer to cover the first active layer, the source electrode, and the drain electrode; and patterning the second semiconductor layer to form the second active layer.

30. The method of claim 28, further comprising:

forming a first semiconductor layer on the first gate insulating layer;

forming the source electrode and the drain electrode on the first semiconductor layer;

forming a second semiconductor layer to cover the first semiconductor layer, the source electrode, and the drain electrode; and patterning the second semiconductor layer and the first semiconductor layer to form the first and second active layers.

31. The method of claim 28, wherein at least one of the first and second active layers includes an oxide semiconductor.

32. The method of claim 28, wherein at least one of the first and second active layers includes a non-oxide semiconductor.

33. The method of claim 28, wherein one of the first and second active layers includes an oxide semiconductor, and an other one of the first and second active layers includes a non-oxide semiconductor.

* * * * *